(12) United States Patent
Im et al.

(10) Patent No.: US 12,677,552 B2
(45) Date of Patent: Jul. 7, 2026

(54) DISPLAY DEVICE WITH STRETCHABLE NON-DISPLAY REGION INCLUDING FUNCTIONAL PATTERNS AND SIDE METAL PORTIONS

(71) Applicant: Samsung Display Co., LTD., Yongin-si (KR)

(72) Inventors: Daehyuk Im, Yongin-si (KR); Hanbum Kwon, Yongin-si (KR); Kikyung Youk, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 290 days.

(21) Appl. No.: 18/233,794

(22) Filed: Aug. 14, 2023

(65) Prior Publication Data

US 2024/0065052 A1    Feb. 22, 2024

(30) Foreign Application Priority Data

Aug. 16, 2022    (KR) ........................ 10-2022-0102195

(51) Int. Cl.
*H10K 59/131*        (2023.01)
*H10K 59/12*        (2023.01)
(Continued)

(52) U.S. Cl.
CPC ....... *H10K 59/131* (2023.02); *H10K 59/1201* (2023.02); *H10K 59/88* (2023.02); *H10K 2102/311* (2023.02)

(58) Field of Classification Search
CPC .. H10K 59/131; H10K 59/1201; H10K 59/88; H10K 2102/311; H10K 77/111; H10K 59/12; H10K 50/844; H10K 59/124; H10K 71/00; H05K 1/111; H05K 1/118; H05K 3/323
See application file for complete search history.

(56) References Cited

U.S. PATENT DOCUMENTS

| 8,125,607 B2 | 2/2012 | Mochizuki |
|---|---|---|
| 9,773,613 B2 | 9/2017 | Lee et al. |

(Continued)

FOREIGN PATENT DOCUMENTS

| JP | 2018066933 A | 4/2018 |
|---|---|---|
| KR | 20170074101 A | 6/2017 |

(Continued)

*Primary Examiner* — J. E. Schoenholtz
(74) *Attorney, Agent, or Firm* — CANTOR COLBURN LLP

(57) ABSTRACT

A display device includes: a display panel divided into a non-display region including a stretchable region and a display region adjacent to the non-display region, and a flexible printed circuit board disposed to overlap the stretchable region and including circuit pads, where the display panel includes: display pads disposed to overlap the stretchable region and electrically connected to the circuit pads at least partially, and a functional pattern disposed to overlap the stretchable region, and spaced apart from the display pads in a plan view. The functional pattern includes an insulating portion, a first metal portion disposed on a first side surface of the insulating portion, and a second metal portion disposed on a second side surface of the insulating portion opposite to the first side surface.

20 Claims, 10 Drawing Sheets

(51) Int. Cl.
  *H10K 59/88*    (2023.01)
  *H10K 102/00*   (2023.01)

(56)      References Cited

U.S. PATENT DOCUMENTS

| | | | |
|---|---|---|---|
| 10,223,974 B2 | 3/2019 | Tokuda | |
| 10,830,655 B2 | 11/2020 | Cook | |
| 2020/0194906 A1* | 6/2020 | Im | H01R 43/00 |
| 2021/0247820 A1* | 8/2021 | Oh | G06F 1/183 |
| 2021/0298173 A1* | 9/2021 | Gisby | G01D 5/24 |

FOREIGN PATENT DOCUMENTS

| | | | |
|---|---|---|---|
| KR | 20200121812 A | 10/2020 | |
| KR | 102319865 B1 | 10/2021 | |
| KR | 102341223 B1 | 12/2021 | |
| KR | 20220013786 A | 2/2022 | |

* cited by examiner

DISPLAY DEVICE WITH STRETCHABLE NON-DISPLAY REGION INCLUDING FUNCTIONAL PATTERNS AND SIDE METAL PORTIONS

This application claims priority to Korean Patent Application No. 10-2022-0102195, filed on Aug. 16, 2022, and all the benefits accruing therefrom under 35 U.S.C. § 119, the contents of which in their entirety are herein incorporated by reference.

BACKGROUND

The present disclosure herein relates to a display panel, a display device, and a method of manufacturing the display panel, and more particularly, to a display panel, a display device, and a method of manufacturing the display panel having improved reliability by being able to precisely measure the rate of elongation of the display panel, which occurs in a process of bonding the display panel and a flexible printed circuit board to each other.

A display device such as a television, a monitor, a smart phone, and a tablet that provides an image to a user includes a display panel that displays an image. As the display panel, various display panels such as a liquid crystal display panel, an organic light-emitting display panel, an electro-wetting display panel, and an electrophoretic display panel are being developed.

Along with the development of display device technologies, a display device including a flexible display panel has been developed. The display panel includes a plurality of pixels configured to display an image and a driving circuit configured to drive the pixels. In order to reduce the thickness of the display device, pixels may be disposed in a display region of the display panel, and a flexible printed circuit board on which driving circuits are mounted may be connected to a non-display region of the display panel.

SUMMARY

The present disclosure provides a display device having improved reliability.

The present disclosure also provides a method for manufacturing a display panel, the method being capable of precisely measuring a degree of elongation of the display panel in a process of bonding a flexible printed circuit board and the display panel to each other, and the display panel and a display device which are manufactured through the method.

An embodiment of the invention provides a display device including: a display panel divided into a non-display region including a stretchable region and a display region adjacent to the non-display region; and a flexible printed circuit board disposed to overlap the stretchable region and including circuit pads, where the display panel includes: display pads disposed to overlap the stretchable region and electrically connected to the circuit pads at least partially; and a functional pattern disposed to overlap the stretchable region, and spaced apart from the display pads on a plane. The functional pattern includes an insulating portion, a first metal portion disposed on a first side surface of the insulating portion, and a second metal portion disposed on a second side surface of the insulating portion, which is opposite to the first side surface.

In an embodiment, the stretchable region may include a pad region and a non-pad region adjacent to the pad region, the display pad may be disposed to overlap the pad region, and the functional pattern may be disposed to overlap the non-pad region.

In an embodiment, the functional pattern may be provided in plurality, wherein the plurality of functional patterns may be arranged in a matrix form along a first direction, in which the first metal portion and the second metal portion are arranged, and a second direction crossing the first direction.

In an embodiment, the display panel may further include a buffer layer disposed below the functional pattern.

In an embodiment, the display panel may further include signal lines connected to the display pads, and the first metal portion and the second metal portion may be connected to at least some of the signal lines, respectively.

In an embodiment, the display panel may further include a base layer disposed below the display pads, a conductive layer disposed on the base layer, an insulating layer having at least a portion disposed on the conductive layer, and a light-emitting element disposed to overlap the display region, and the functional pattern may be disposed on the insulating layer. The insulating layer may include a first insulating layer, a second insulating layer disposed on the first insulating layer, and a third insulating layer disposed on the second insulating layer, and the functional pattern may be disposed on the third insulating layer.

In an embodiment, the display pads may include an input pad and a panel dummy pad, wherein at least a portion of the input pad may be connected to the light-emitting element. The display panel may further include signal lines connected to the display pads, wherein the signal lines may include at least one panel dummy line connected to the panel dummy pad.

In an embodiment, the first metal portion and the second metal portion may be connected to at least some of the panel dummy lines, respectively.

In an embodiment, the display device may further include a conductive adhesive film disposed between the display panel and the flexible circuit board, and the conductive adhesive film may electrically connect the display pads and the circuit pads to each other.

In an embodiment, the display panel may further include a base layer disposed below the display pad, wherein the base layer may contain a flexible material.

In an embodiment, the flexible printed circuit board may include a circuit base layer on which the circuit pads are disposed, wherein the circuit base layer may contain a flexible material.

In an embodiment, the insulating portion may contain polypropylene or polyester, and the first metal portion and the second metal portion may contain at least any one of aluminum (Al), titanium (Ti), copper (Cu), or gold (Au).

In an embodiment of the invention, the display panel includes: a base layer divided into a display region and a non-display region; a circuit element layer disposed on the base layer and including a display pad and a functional layer, which overlap the non-display region and are spaced apart from each other on a plane; and a display element layer including a light-emitting element overlapping the display region and disposed on the circuit element layer, where the functional layer includes a plurality of functional patterns arranged in a matrix form along a first direction and a second direction crossing the first direction, and each of the plurality of functional patterns includes an insulating portion, a first metal portion disposed on a first side surface of the insulating portion, and a second metal portion disposed on a second side surface of the insulating portion opposite to the first side surface.

In an embodiment of the invention, a method for manufacturing a display device includes: forming a plurality of insulating portions in a matrix form along a first direction and a second direction crossing the first direction on a base layer, where the base layer is divided into a non-display region in which a display pad is disposed and a display region adjacent to the non-display region; forming a metal layer on the plurality of insulating portions; and removing sub-metal portions disposed over the upper surface of each of the insulating portions from each of the insulating portions such that at least a portion of the upper surface of each of the insulating portions is exposed, where, in the forming of the plurality of insulating portions, the plurality of insulating portions is formed so as to overlap the non-display region and be spaced apart from the display pad on a plane.

In an embodiment, the non-display region may include a pad region and a non-pad region, the display pad may be disposed in the pad region, and the plurality of insulating portions may be formed in the non-pad region.

In an embodiment, the method may further include forming a buffer layer on the display panel so as to overlap the non-display region prior to the forming of the plurality of insulating portions.

In an embodiment, the removing of the sub-metal portions may be performed by removing the sub-metal portions through laser irradiation.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
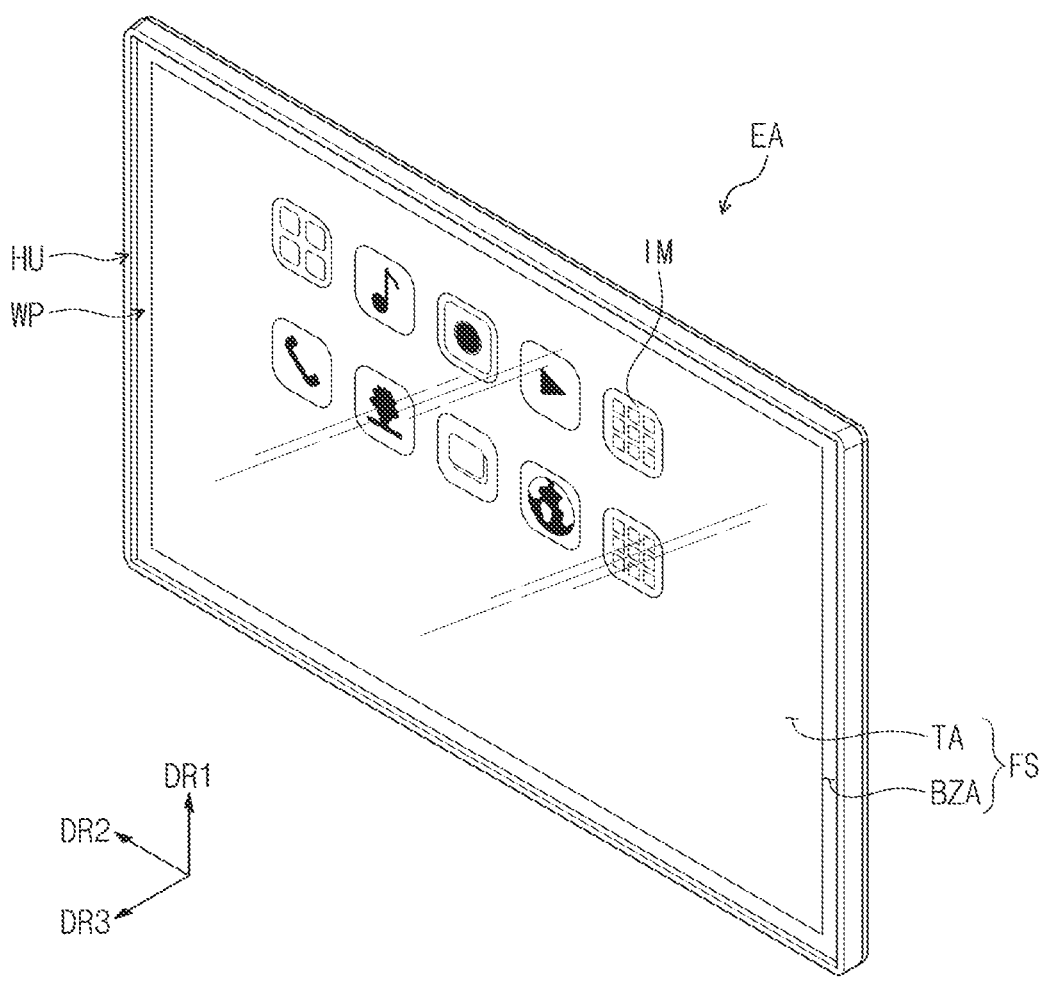
FIG. 1 is a combined perspective view of a display device according to an embodiment of the invention.

In this specification, it will be understood that when an element (or region, layer, portion, etc.) is referred to as being "on", "connected to" or "coupled to" another element, it can be directly on, connected or coupled to the other element, or intervening elements may be present.

Like reference numerals refer to like elements throughout. In addition, in the drawings, the thicknesses, ratios, and dimensions of components are exaggerated for effective description of the technical features. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations that the associated components can define.

It will be understood that, although the terms "first," "second," etc. may be used herein to describe various elements, these elements should not be limited by these terms. These terms are only used to distinguish one element from another element. For example, a first element could be termed a second element without departing from the scope of the invention. Similarly, the second element may also be referred to as the first element. The terms of a singular form include plural forms unless otherwise specified.

In addition, terms, such as "under", "lower", "above", "upper" and the like, are used herein for ease of description to describe one element's relation to another element(s) as illustrated in the figures. The above terms are relative concepts and are described based on the directions indicated in the drawings.

It will be understood that the terms "include" and/or "have", when used in this specification, specify the presence of stated features, integers, steps, operations, elements, components and/or combinations thereof, but do not preclude the presence or addition of one or more other features, integers, steps, operations, elements, components, and/or combinations thereof.

Hereinafter, a display device according to an embodiment of the invention will be described with reference to the accompanying drawings.

Figure 2:
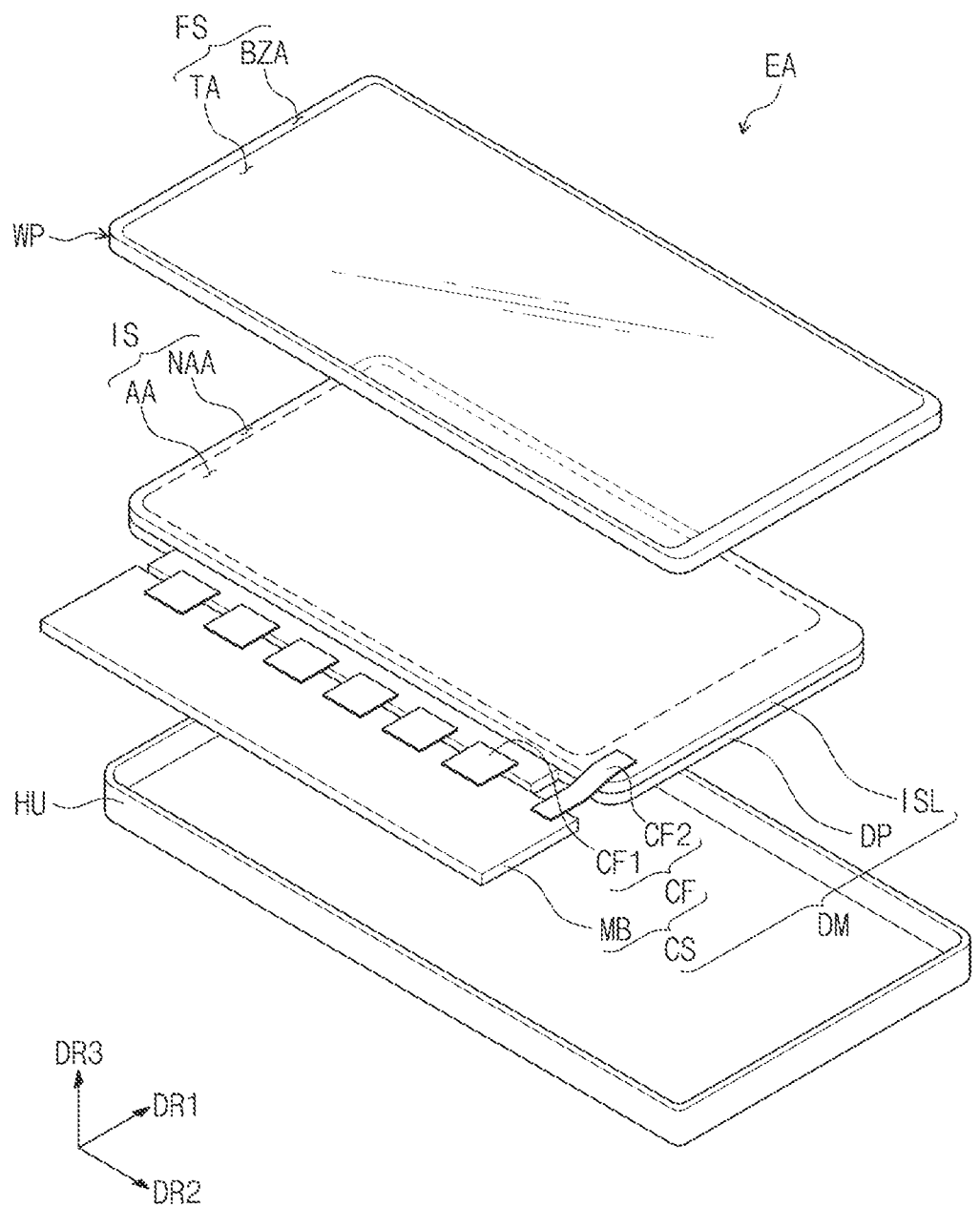
FIG. 2 is an exploded perspective view of the display device according to an embodiment of the invention.

FIG. 1 is a combined perspective view of a display device according to an embodiment of the invention. FIG. 2 is an exploded perspective view of the display device according to an embodiment of the invention.

Referring to FIGS. 1 and 2, the display device EA may be activated according to an electrical signal. The display device EA may include various embodiments. For example, the display device EA may be used not only for large electronic devices such as televisions, monitors, or external billboards, but also for small and medium-sized electronic devices such as personal computers, notebook computers, personal digital terminals, car navigation units, game consoles, portable electronic devices, or cameras. In addition, these are merely presented as examples, and the display device EA may be employed in other electronic devices without departing from the concept of the present invention. In this embodiment, the display device EA is exemplarily illustrated as a monitor.

The display device EA may display an image IM toward a third direction DR3 on a display surface FS parallel to each of a first direction DR1 and a second direction DR2. The image IM may include a still image as well as a dynamic image. FIG. 1 illustrates a watch window and icons as an example of the image IM. The display surface FS on which the image IM is displayed may correspond to the front surface of the display device EA, and the front surface of a window panel WP.

In this embodiment, the front surface (or upper surface) and the rear surface (or lower surface) of each member are defined based on a direction in which the image IM is displayed. The front surface and the rear surface may be opposite to each other in the third direction DR3, and the normal direction of each of the front surface and the rear surface may be parallel to the third direction DR3. Directions indicated by the first to third directions DR1, DR2, and DR3 are relative concepts and may be converted into other directions. In this specification, the expression "on a plane" may mean when viewed from the third direction DR3 (i.e., thickness direction of a display panel). That is, "on a plane" has the same meaning as "in a plan view."

The display device EA may include a window panel WP, a display module DM, and a housing HU. In this embodiment, the window panel WP and the housing HU are coupled to each other to form the exterior of the display device EA.

The window panel WP may contain an optically transparent insulating material. For example, the window panel WP may contain glass or plastic. The window panel WP may have a multi-layered structure or a single-layered structure. For example, the window panel WP may include a plurality of plastic films bonded to each other with an adhesive, or a glass substrate and a plastic film bonded to each other with an adhesive.

As described above, the display surface FS of the window panel WP defines the front surface of the display device EA. A transmission region TA may be an optically transparent region. For example, the transmission region TA may have a visible light transmittance of about 90% or more.

A bezel region BZA may have a relatively low light transmittance compared to the transmission region TA. The bezel region BZA defines the shape of the transmission region TA. The bezel region BZA may be adjacent to and surround the transmission region TA.

The bezel region BZA may have a predetermined color. The bezel region BZA may cover a peripheral region NAA of the display module DM so as to block the peripheral region NAA from being viewed from the outside. This is illustrated as an example, and in the window panel WP according to an embodiment of the invention, the bezel region BZA may be omitted.

Although not illustrated, an anti-reflection layer may be disposed between the window panel WP and the display module DM. The anti-reflection layer may reduce the reflectance of external light incident from the outside of the display device EA. The anti-reflection layer may include color filters. The color filters may have a predetermined arrangement. For example, the color filters may be arranged in consideration of light-emitting colors of pixels included in the display panel DP, which will be described later. In addition, the anti-reflection layer may further include a black matrix adjacent to the color filters.

The display module DM may display an image IM and sense an external input. The external input may include various types of inputs provided from the outside of the display module DM. Inputs applied from the outside may be provided in various forms.

For example, the external input may include not only a touch by a part of a body such as a user's hand, but also an external input (e.g., hovering) applied at a place close to or at a predetermined close distance from the display module DM. In addition, the external input may have various forms such as force, pressure, and light and is not limited to any one embodiment.

The display module DM includes a front surface IS including an active region AA and a peripheral region NAA. The active region AA may be activated according to an electrical signal.

In this embodiment, the active region AA may be a region in which an image IM is displayed and may also be a region in which an external input is sensed. The transmission region TA overlaps at least the active region AA. For example, the transmission region TA overlaps the entire surface of the active region AA or at least a portion thereof. Accordingly, a user may visually recognize the image IM through the transmission region TA or provide an external input. However, this is illustrated as an example, and in the active region AA, a region in which the image IM is displayed and a region in which the external input is sensed may be separated from each other, and the invention is not limited to any one embodiment.

The peripheral region NAA may be covered by the bezel region BZA. The peripheral region NAA is adjacent to the active region AA. The peripheral region NAA may surround the active region AA. A driving circuit or a driving line configured to drive the active region AA may be disposed in the peripheral region NAA.

The display module DM includes a display panel DP, an input sensing unit ISL, and a circuit board CS.

The display panel DP may be configured to substantially generate an image IM. The image IM generated by the display panel DP is visually recognized by a user from the outside through the transmission region TA.

The input sensing unit ISL senses an external input applied from the outside. As described above, the input sensing unit ISL may sense the external input provided to the window panel WP.

The circuit board CS is electrically connected to the display panel DP. The circuit board CS includes a main circuit board MB and a flexible printed circuit board CF. The flexible printed circuit board CF may include a panel circuit board CF1 and an input circuit board CF2. The flexible printed circuit board CF and the main circuit board MB bonded to the display panel DP may be bent and disposed on the rear surface of the display panel DP.

The panel circuit board CF1 is electrically connected to the display panel DP. The panel circuit board CF1 may connect the display panel DP and the main circuit board MB to each other. In this embodiment, the panel circuit board CF1 is illustrated as a flexible circuit film having the main circuit board MB connected at an end thereof.

The panel circuit board CF1 may be provided in plurality to connect the display panel DP and the main circuit board MB to each other. The panel circuit board CF1 may be provided in plurality at one end of the second direction DR1 to connect the display panel DP and the main circuit board MB. Although not illustrated, the panel circuit board CF1 may be provided in plurality at the other end of the first direction DR1, the panel circuit board CF1 may be provided in plurality at any one of opposite ends of the second direction DR2, and the panel circuit board CF1 may be provided in singularity.

The panel circuit board CF1 may be connected to display pads SD (see FIG. 6B) of the display panel DP, which are disposed in the peripheral region NAA. The panel circuit board CF1 provides the display panel DP with an electrical signal for driving the display panel DP. The electrical signal may be generated from the panel circuit board CF1 or the main circuit board MB.

The flexible printed circuit board CF may further include an input circuit board CF2 electrically connected to the input sensing unit ISL. The input circuit board CF2 may connect the input sensing unit ISL and the main circuit board MB to each other. In this embodiment, the input circuit board CF2 may be provided as a flexible circuit film to connect the input sensing unit ISL and the main circuit board MB to each other. Although not illustrated, in another embodiment, the input circuit board CF2 may be omitted, and the panel circuit board CF1 may connect the input sensing unit ISL and the main circuit board MB to each other. That is, the panel circuit board CF1 may include an input circuit electrically connected to the input sensing unit ISL. Additional components for electrical connection between the input sensing unit ISL and the panel circuit board CF1 may be disposed. The input circuit board CF2 may be connected to pads (not illustrated) of the input sensing unit ISL disposed in the peripheral region NAA. The input circuit board CF2 provides the input sensing unit ISL with an electrical signal for driving the input sensing unit ISL. The electrical signal may be generated from the input circuit board CF2 or the main circuit board MB.

The main circuit board MB may include various driving circuits configured to drive the display module DM or connectors configured to supply power. Each of the panel circuit board CF1 and the input circuit board CF2 may be connected to the main circuit board MB. According to the invention, it is possible to easily control the display module DM through one main circuit board MB. However, this is illustrated as an example, and in the display module DM according to an embodiment of the invention, the display panel DP and the input sensing unit ISL may be connected to different main circuit boards.

Although not illustrated, according to another embodiment of the invention, the main circuit board MB may be mounted directly on the display module DM. That is, the circuit board CS may be configured only with the main circuit board MB, and the flexible printed circuit board CF may be omitted. Alternatively, any one of the panel circuit board CF1 and the input circuit board CF2 may not be connected to the main circuit board MB, and the invention is not limited to any one embodiment.

Hereinafter, the display device DD according to the invention will be described with a focus on the bonded structure of the display panel DP, the flexible printed circuit board CF, and the main circuit board MB.

The housing HU is coupled to the window panel WP. The housing HU is coupled to the window panel WP to provide a predetermined internal space. The display module DM may be accommodated in the internal space.

The housing HU may contain a material having a relatively high rigidity. For example, the housing HU may include a plurality of frames and/or plates made of glass, plastic, metal, or a combination thereof. The housing HU may stably protect the components of the display device EA, which are accommodated in the internal space, from an external impact.

Figure 3:
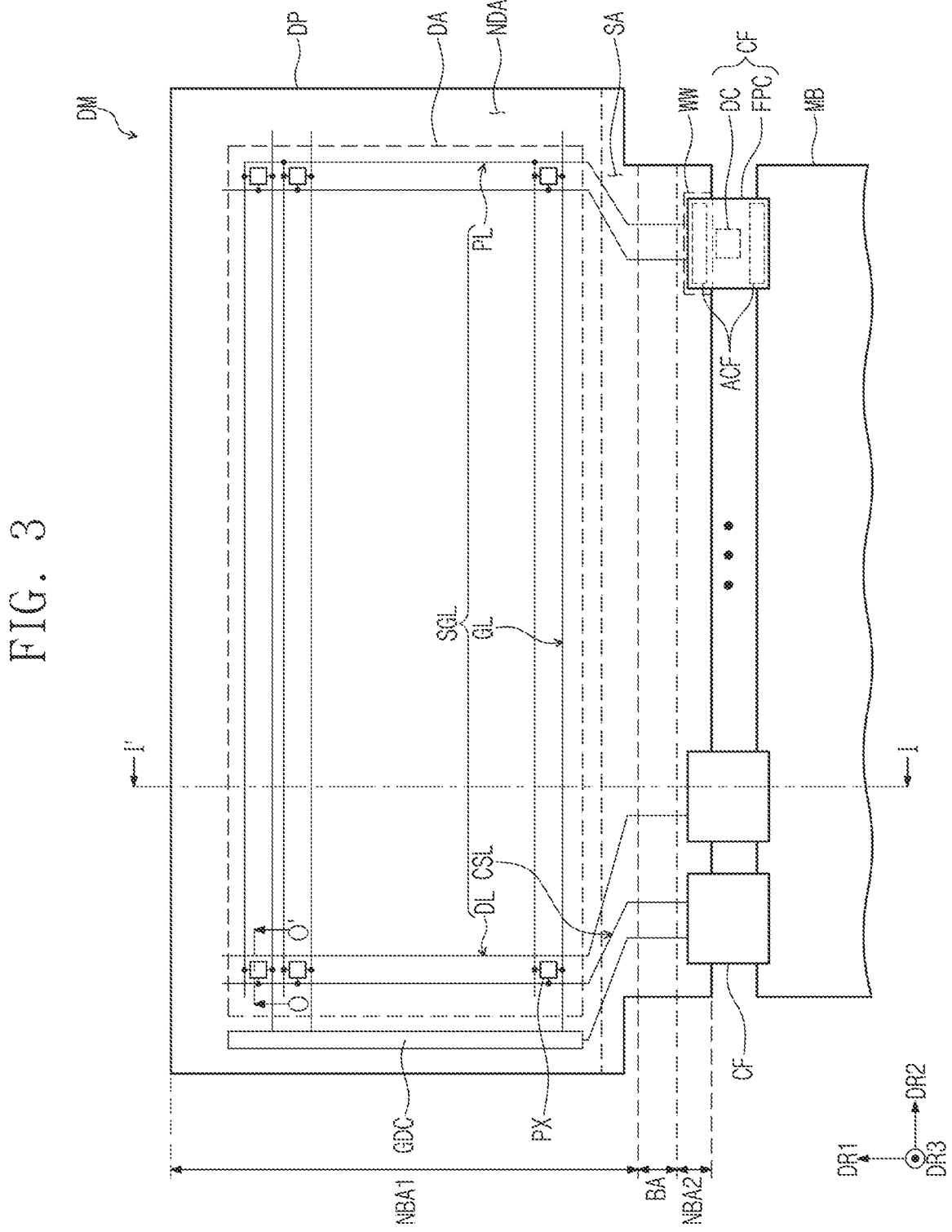
FIG. 3 is a plan view of a display module according to an embodiment of the invention.

FIG. 3 is a plan view of a display module according to an embodiment of the invention.

Referring to FIG. 3, the display module DM according to an embodiment of the invention may include a display panel DP, a flexible printed circuit board CF, and a main circuit board MB. The flexible printed circuit board CF may include a flexible circuit board FPC and a data driving circuit DC.

In this embodiment, the display module DM may include the main circuit board MB electrically connected to the flexible printed circuit board CF through a conductive adhesive film ACF.

A display region DA in which a pixel PX is disposed and a non-display region NDA adjacent to the display region DA may be defined in the display panel DP. The display panel DP may include a bending region BA and a first non-bending region NBA1 and a second non-bending region NBA2 arranged to be spaced apart from each other in the second direction DR2 with the bending region BA interposed therebetween. The first non-bending region NBA1 may be defined as a region overlapping the display region DA, and the second non-bending region NBA2 may be defined as a region to which the flexible printed circuit board CF is connected. The bending region BA may be defined as a region in which the display panel DP is bent along a virtual bending axis extending in the second direction DR2. According to an embodiment of the invention, the width of the first non-bending region NBA1 in the first direction DR1 may be greater than the widths of the bending region BA and the second non-bending region NBA'. However, the embodiment of the invention is not limited thereto, and the width of the bending region BA in the second direction DR1 may be provided in a shape that becomes narrower from the first non-bending region NBA1 to the second non-bending region NBA2 in another embodiment, and the invention is not limited to any one embodiment.

The display panel DP may include a stretchable region SA to which the flexible printed circuit board CF is bonded. The stretchable region SA may be defined in the non-display region NDA. The stretchable region SA may correspond to a region in which a portion of the display panel DP stretches in the first direction DR1 or the second direction DR2 as the flexible printed circuit board CF is bonded to the display panel DP by the conductive adhesive film ACF. The stretchable region SA may include a bending region BA and a second non-bending region NBA2. The stretchable region SA may include a pad region PA (see FIG. 8) in which the flexible printed circuit board CF is disposed and a non-pad region NPA adjacent to the pad region PA (see FIG. 8).

Although FIG. 3 illustrates that the bending region BA is defined at the lower end of the first direction DR1, a bending region may be defined at the upper end of the first direction DR1 or bending regions may be defined at opposite ends of the second direction DR2, respectively.

As illustrated in FIG. 3, the display panel DP may display a desired image by applying a driving signal to a plurality of pixels PX. The plurality of pixels PX may be disposed in a matrix form along the first direction DR1 and the second direction DR2 orthogonal to the first direction DR1. In an embodiment of the invention, the pixels PX may include first to third pixels configured to display a red color, a green color, and a blue color, respectively. In an embodiment of the invention, the pixels PX may further include some of the pixels configured to display a white color, a cyan color, and a magenta color, respectively.

Each of the pixels PX includes an organic light-emitting diode and a driving circuit GDC connected thereto. The driving circuit GDC and signal lines SGL may be included in a circuit element layer DP-CL illustrated in FIG. 4.

The driving circuit GDC may include a scan driving circuit. The scan driving circuit generates a plurality of scan signals (hereinafter, referred to as scan signals) and sequentially outputs the scan signals to a plurality of scan lines GL (hereinafter, referred to as scan lines) to be described later.

The scan driving circuit may further output another control signal to the driving circuit of the pixels PX.

The scan driving circuit may include a plurality of thin-film transistors formed through the same process as the driving circuit of the pixels PX, for example, a low temperature polycrystalline silicon ("LTPS") process or a low temperature polycrystalline oxide (LTPO) process.

The signal lines SGL include scan lines GL, data lines DL, a power line PL, and a control signal line CSL. The scan lines GL are connected to corresponding pixels PX among the pixels PX, respectively, and the data lines DL are connected to corresponding pixels PX among the pixels PX, respectively. The power line PL is connected to the pixels PX. The control signal line CSL may provide control signals to the scan driving circuit. The signal lines SGL may overlap the display region DA and the non-display region NDA. As described later, display pads SD (see FIG. 8) may be connected to the ends of the signal lines SGL.

A black matrix (not illustrated) configured to block light may be disposed in the non-display region NDA. The driving circuit GDC configured to supply a gate signal to the plurality of pixels PX may be provided in the non-display region NDA. In an embodiment of the invention, a data driving circuit (not illustrated) may be further provided in the non-display region NDA. The pad region PA (see FIG. 8) for receiving a signal supplied from the flexible printed circuit board CF may be defined in the stretchable region SA.

According to the types of the plurality of pixels PX, the display panel DP may be divided into a liquid crystal display panel, an organic electro-luminescence display panel, an electro-wetting display panel, a quantum dot light-emitting display panel, and the like. In this embodiment, the display panel DP may be an organic electro-luminescence display panel.

Figure 4:
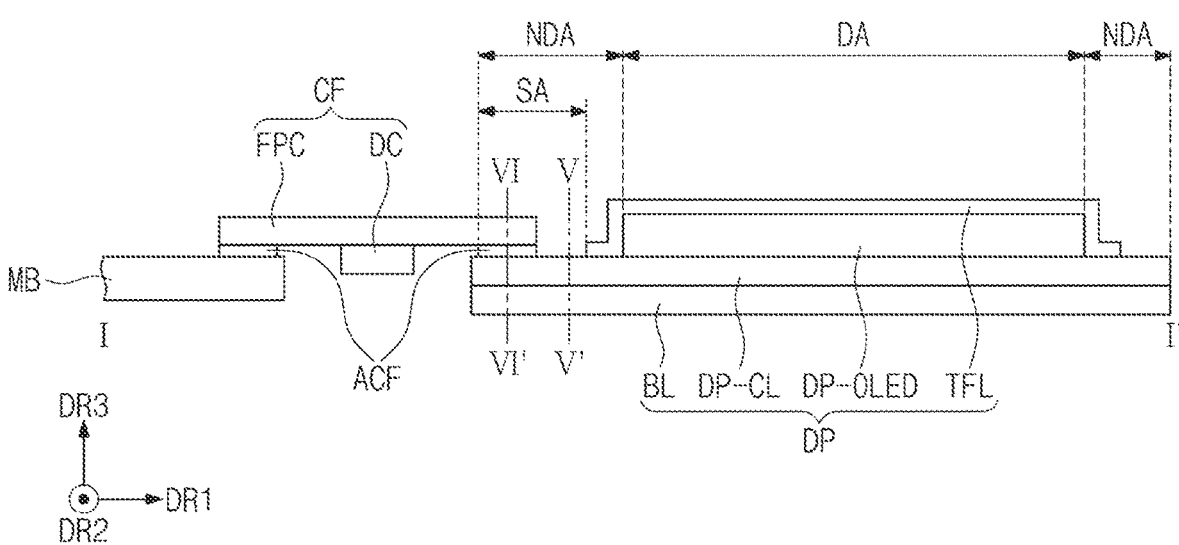
FIG. 4 is a cross-sectional view of the display module according to an embodiment of the invention.

FIG. 4 is a cross-sectional view of the display module according to an embodiment of the invention. FIG. 4 is a cross-sectional view taken along line I-I' illustrated in FIG. 3.

As illustrated in FIG. 4, the display panel DP includes a base layer BL, a circuit element layer DP-CL disposed on the base layer BL, a display element layer DP-OLED, and an encapsulation layer TFL. In this specification, the expression "a region/portion and a region/portion correspond to each other" means that "they overlap each other", and unless otherwise specified, the expression is not limited to having a same area and/or a same shape.

The base layer BL may be optically transparent. In an embodiment of the invention, the base layer BL may have a flexible characteristic. For example, the base layer BL may contain a synthetic resin such as polyimide. Alternatively, the base layer BL may contain ultra-thin glass ("UTG"). Specifically, the base layer BL may contain glass and have a thickness of about 20 micrometers ($\mu$m) to about 80 $\mu$m in the thickness direction (i.e., third direction DR3). When the thickness of the window WM exceeds about 80 $\mu$m, the flexible characteristic of the window WM may be deteriorated, thus making it difficult to perform the folding and unfolding operations of the display device.

The circuit element layer DP-CL includes at least one insulating layer and a circuit element. The insulating layer includes at least one inorganic layer and at least one organic layer. The circuit element includes signal lines, a pixel driving circuit, and the like. The circuit element layer DP-CL may further include a display pad SD (see FIG. 7a)

and a functional layer (not shown), which overlap the non-display region NDA and are spaced apart from each other in a plan view.

The display element layer DP-OLED includes at least organic light-emitting diodes as a light-emitting element. The display element layer DP-OLED may further include an organic layer such as a pixel defining film.

The encapsulation layer TFL includes a plurality of thin films. Some thin films are disposed to improve optical efficiency, and other thin films are disposed to protect organic light-emitting diodes.

As illustrated in FIG. 4, the flexible printed circuit board CF includes a flexible circuit board FPC and a data driving circuit DC. The data driving circuit DC may include at least one driving chip. The data driving circuit DC is electrically connected to the lines of the flexible circuit board FPC.

When the flexible printed circuit board CF includes the data driving circuit DC, the pad portion of the display panel DP may include: data pads electrically connected to the data lines; and control signal pads electrically connected to the control signal lines. The data lines may be connected to the pixels PX, and the control signal lines may be connected to the driving circuit GDC. In the display device according to an embodiment of the invention, a chip-on-film structure in which the data driving circuit DC is mounted on the flexible printed circuit board CF is illustrated, but the embodiment of the invention is not limited thereto, and the data driving circuit DC may be disposed on the base layer BL or the circuit element layer DP-CL of the display panel DP in another embodiment.

The main circuit board MB provides image data, a control signal, a power supply voltage, and the like to the display panel DP or the data driving circuit DC. The main circuit board MB is a wiring board larger than the flexible circuit board FPC and may include active elements and passive elements. The main circuit board MB is a flexible wiring board or a rigid wiring board and may include a pad portion (not illustrated) connected to the flexible circuit board FPC.

Figure 5:
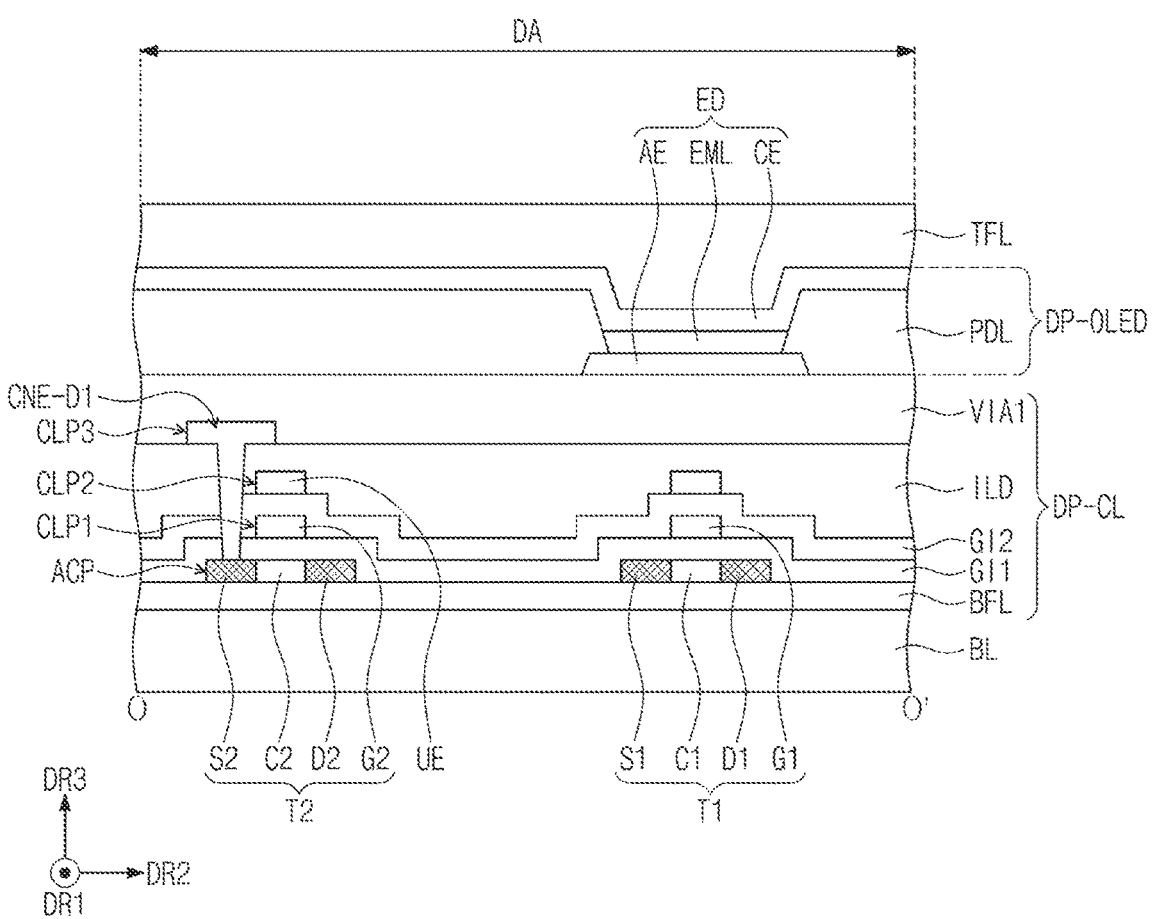
FIG. 5 is a cross-sectional view of a display panel according to an embodiment of the invention.

FIG. 5 is a cross-sectional view of a display panel according to an embodiment of the invention. FIG. 5 is a cross-sectional view taken along line O to O' of FIG. 3.

FIG. 5 illustrates a cross-sectional view of the display region DA of the display panel DP.

Referring to FIG. 5, the display panel DP may include a bottom insulating layer BFL, a first gate insulating layer GI1, a second gate insulating layer GI2, an interlayer-insulating layer ILD, an upper insulating layer VIA1, a semiconductor pattern ACP including a plurality of patterns, a first conductive layer CLP1 including a plurality of patterns, a second conductive layer CLP2 including a plurality of patterns, and a third conductive layer CLP3 including a plurality of patterns. Here, the first conductive layer CLP1 may include a first gate metal pattern, the second conductive layer CLP2 may include a second gate metal pattern, and the third conductive layer CLP3 may include a first data metal pattern. In an embodiment of the invention, each of the first gate insulating layer GI1, the second gate insulating layer GI2, and the interlayer-insulating layer ILD includes an organic layer and/or an inorganic layer. In an embodiment of the invention, each of the first gate insulating layer GI1, the second gate insulating layer GI2, and the first insulating layer ILD1 may include a plurality of inorganic thin films. The plurality of inorganic thin films may include a silicon nitride layer and a silicon oxide layer. In an embodiment of the invention, each of the first conductive layer CLP1 and the second conductive layer CLP2 may contain molybdenum (Mo), but the embodiment of the invention is not limited thereto.

In an embodiment of the invention, the third conductive layer CLP3 may include at least any one of aluminum (Al) or titanium (Ti), but the embodiment of the invention is not limited thereto. In an embodiment of the invention, the third conductive layer CLP3 may have a structure in which titanium, aluminum, and titanium are sequentially stacked.

The bottom insulating layer BFL may be disposed on the base layer BL. The bottom insulating layer BFL may include a first buffer layer and a second buffer layer. The second buffer layer may be disposed on the first buffer layer. The bottom insulating layer BFL prevents impurities existing in the base layer BL from flowing into the pixel PX. In particular, the bottom insulating layer BFL prevents impurities from diffusing into the semiconductor pattern ACP of transistors T1 and T2 which constitute the pixel PX.

The impurities may be introduced from the outside or generated by thermal decomposition of the base layer BL. The impurities may be a gas or sodium discharged from the base layer BL. In addition, the bottom insulating layer BFL may block moisture from being introduced into the pixel PX from the outside.

The semiconductor pattern ACP is disposed on a bottom insulating layer BFL. In an embodiment of the invention, the semiconductor pattern ACP may be disposed on the bottom insulating layer BFL.

The semiconductor pattern ACP may constitute each of the transistors T1 and T2. The semiconductor pattern ACP may contain polysilicon, amorphous silicon, or a metal oxide semiconductor. FIG. 5 illustrates a semiconductor pattern which constitutes a source S1, an active C1, and a drain D1 of the first transistor T1 and a semiconductor pattern which constitutes a source S, an active C2, and a drain D2 of the second transistor T2.

The first gate insulating layer GI1 may be disposed on the bottom insulating layer BFL and cover the semiconductor pattern ACP. The first conductive layer CLP1 may be disposed on the first gate insulating layer GI1. A gate G1 of the first transistor T1 and a gate G2 of the second transistor T2 are illustrated in the first conductive layer CLP1. Although not illustrated separately, in an embodiment of the invention, the first conductive layer CLP1 may include any one of two electrodes which constitute a capacitor of the pixel PX.

The second gate insulating layer GI2 may be disposed on the first gate insulating layer GI1 and cover the first conductive layer CLP1. The second conductive layer CLP2 may be disposed on the second gate insulating layer GI2. In an embodiment of the invention, the second conductive layer CLP2 may be the other one of the two electrodes which constitutes the capacitor (not shown) of the pixel PX. An upper electrode UE is illustrated as the second conductive layer CLP2.

The interlayer-insulating layer ILD may be disposed on the second gate insulating layer GI2 and cover the second conductive layer CLP2. First connection electrodes CNE-D1 of the third conductive layer CLP3 may be connected to the gate G1 of the first transistor T1 and the source S2 of the second transistor T2, respectively. The upper insulating layer VIA1 may be disposed on the interlayer-insulating layer ILD and cover the third conductive layer CLP3.

In the display region DA of FIG. 5, the display element layer DP-OLED may include a light-emitting element ED and a pixel defining film PDL. The light-emitting element ED may include an anode electrode AE, a light-emitting layer EML, and a cathode electrode CE. The pixel defining film PDL may correspond to a layer defining pixels.

The anode electrode AE may be disposed on the upper insulating layer VIA1. The anode electrode AE may be electrically connected to the third conductive layer CLP3 through a contact hole. The pixel defining film PDL may be disposed on the upper insulating layer VIA1 and expose at least a portion of the anode electrode AE. The light-emitting layer EML may be disposed on the anode electrode AE. The cathode electrode CE may be disposed on the light-emitting layer EML.

When the light-emitting element ED is an organic light-emitting diode OLED, the light-emitting layer EML may contain an organic material. The encapsulation layer TFL may seal the display element layer DP-OLED to protect the display element layer DP-OLED from external oxygen or moisture. The encapsulation layer TFL may be a layer in which an organic film and an inorganic film are mixed to each other.

Figure 6A:
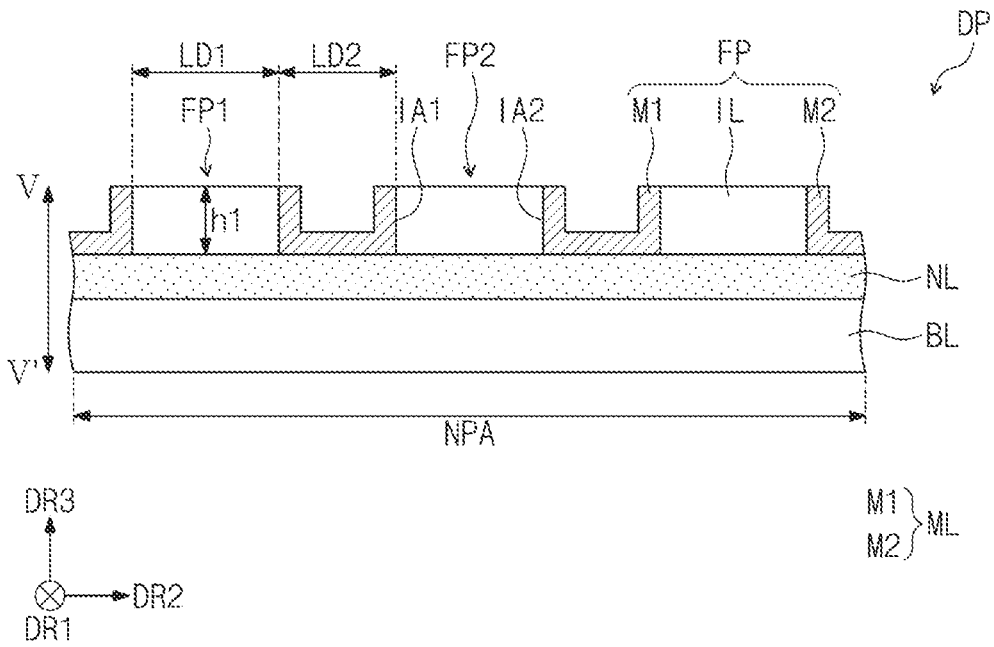
FIG. 6A is a cross-sectional view of a portion of the display panel according to an embodiment of the invention.

FIG. 6A is a cross-sectional view of a portion of the display panel according to an embodiment of the invention. FIG. 6A is an exploded cross-sectional view taken along line V to V' of FIG. 4.

Referring to FIG. 6A, the display panel DP may include a buffer layer NL disposed on the base layer BL and a functional pattern FP disposed on the buffer layer NL.

Referring to FIGS. 4 to 6A together, the buffer layer NL may be disposed on the base layer BL so as to overlap the stretchable region SA. In an embodiment of the invention, the buffer layer NL may be disposed on the bottom insulating layer BFL, the first gate insulating layer GI1, the second gate insulating layer GI2, the interlayer-insulating layer ILD, or the upper insulating layer VIA1. For example, the buffer layer NL may be disposed on the upper insulating layer VIA1. The buffer layer NL may include a silicon nitride layer. However, according to an embodiment of the invention, the buffer layer NL may be omitted.

The functional pattern FP may be disposed on the base layer BL so as to overlap the stretchable region SA. In an embodiment of the invention, the functional pattern FP may be disposed directly on the buffer layer NL. The functional pattern FP may include a metal portion ML and an insulating portion IL. The metal portion ML may include a first metal portion M1 disposed on a first side surface IA1 of the insulating portion IL and a second metal portion M2 disposed on a second side surface IA2 opposite to the first side surface IA1 of the insulating portion IL along the second direction. FIG. 6A exemplarily illustrates that the functional pattern FP has a tetragonal shape or a rectangular parallel-epiped shape, but the embodiment of the invention is not limited thereto, and each of the functional pattern FP, the first metal portion M1, the second metal portion M2, and the insulating portion IL may have any shape.

In an embodiment of the invention, the metal portion ML may contain a metal material. For example, the metal portion ML may contain any one of aluminum (Al), titanium (Ti), copper (Cu), and gold (Au). The first metal portion M1 and the second metal portion M2 of the metal portion ML may be formed through a same process and composed of a same material.

The insulating portion IL may contain an insulating material. For example, the insulating portion IL may contain polypropylene or polyester. In an embodiment of the invention, a width LD1 of the insulating portion IL in the second direction DR2 may be about 1 μm to about 5 μm. A height H1 of the insulating portion IL in the third direction DR3 may be about 1 μm to about 3 μm. In an embodiment of the invention, a separate distance LD2 in the second direction DR2 between the insulating portion IL of the first functional pattern FP1 and the insulating portion IL of the second functional pattern FP2 may be about 1 μm to about 3 μm. However, the embodiment of the invention is not limited thereto, and the materials, widths, or heights of the metal portion ML and the insulating portion IL may be freely designed.

Figure 6B:
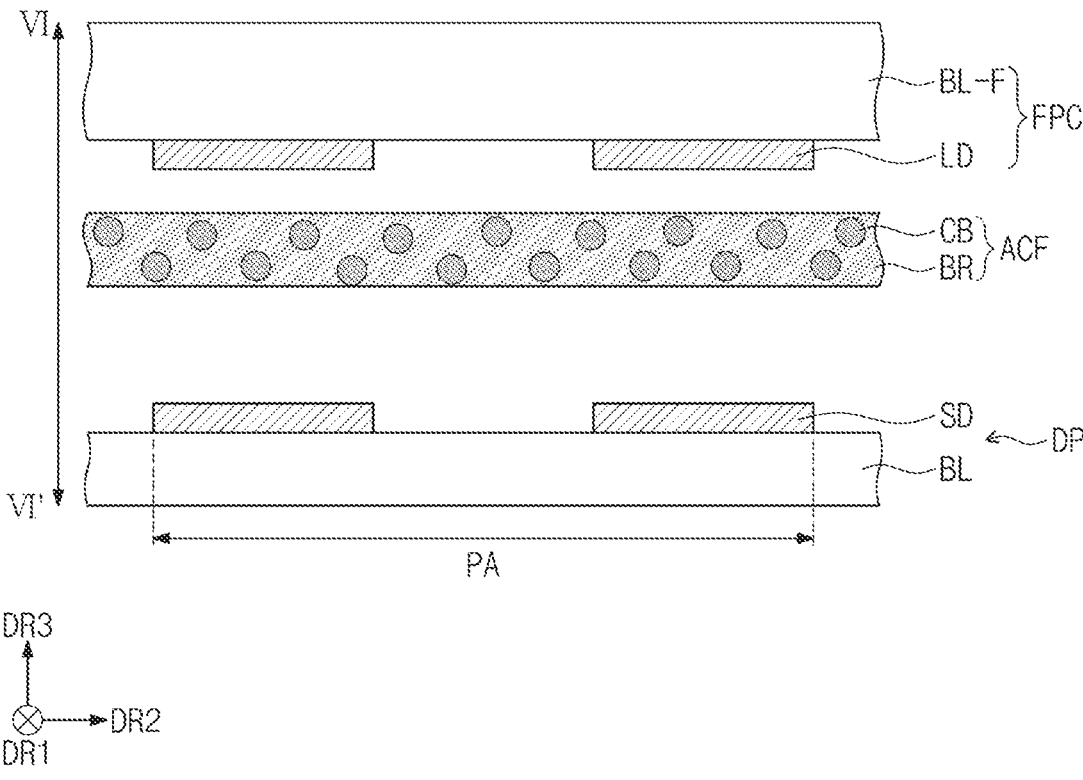
FIG. 6B is a cross-sectional view of a portion of the display module according to an embodiment of the invention.

FIG. 6B is a cross-sectional view of a portion of the display module according to an embodiment of the invention. FIG. 6B is an exploded cross-sectional view taken along line VI to VI' of FIG. 4.

Referring to FIGS. 4 and 6B together, the flexible printed circuit board CF may include a plurality of circuit pads LD. In an embodiment of the invention, the flexible circuit board FPC may include a circuit base layer BL-F and a plurality of circuit pads LD disposed on the circuit base layer BL-F. Each of the plurality of circuit pads LD may be disposed to be spaced apart from each other by a predetermined distance in a plan view. The circuit base layer BL-F corresponds to a component configured to provide the base surface of the flexible printed circuit board CF disposed on the display panel DP. The circuit base layer BL-F may contain a flexible material. For example, the circuit base layer BL-F may be a polyimide film having flexible properties.

Referring to FIGS. 4 and 6B together, the display panel DP may include a plurality of display pads SD. The plurality of display pads SD may be disposed to overlap the stretchable region SA. The plurality of display pads SD may be disposed to overlap the pad region PA of the stretchable region SA. The plurality of display pads SD may come in contact with the circuit pads LD to electrically connect the flexible printed circuit board CF and the display panel DP to each other.

In an embodiment of the invention, the circuit element layer DP-CL of the display panel DP may include a plurality of display pads SD. Each of the plurality of display pads SD may be disposed to be spaced apart from each other at a predetermined distance in the pad region PA. The display pads SD included in the circuit element layer DP-CL may come in contact with the plurality of circuit pads LD. As the plurality of circuit pads LD and the display pads SD come in contact with each other, the flexible printed circuit board CF and the display panel DP may be electrically connected to each other.

A conductive adhesive film ACF may be disposed between the flexible printed circuit board CF and the display panel DP. The conductive adhesive film ACF may be disposed between the flexible printed circuit board CF and the circuit element layer DP-CL in the pad region PA. The circuit pads LD disposed in a substrate pad region PA-CF of the flexible circuit board FPC may be electrically connected to the display pads SD disposed in the pad region PA of the display panel DP by the conductive adhesive film ACF.

The conductive adhesive film ACF may include a plurality of conductive balls CB. When the conductive adhesive film ACF is pressed between the flexible circuit board FPC and the display panel DP, the plurality of conductive balls CB aligned in the first direction may electrically connect the circuit pads of the flexible circuit board FPC and the display pads SD of the display panel DP to each other. The plurality of conductive balls CB may be aligned with each other in the second direction DR2 when the display panel DP and the flexible printed circuit board CF are electrically connected to each other. The conductive adhesive film ACF may further include an adhesive resin BR in which the plurality of conductive balls CB are dispersed. In an embodiment of the invention, the conductive adhesive film ACF may be replaced with a solder bump.

Figure 7A:
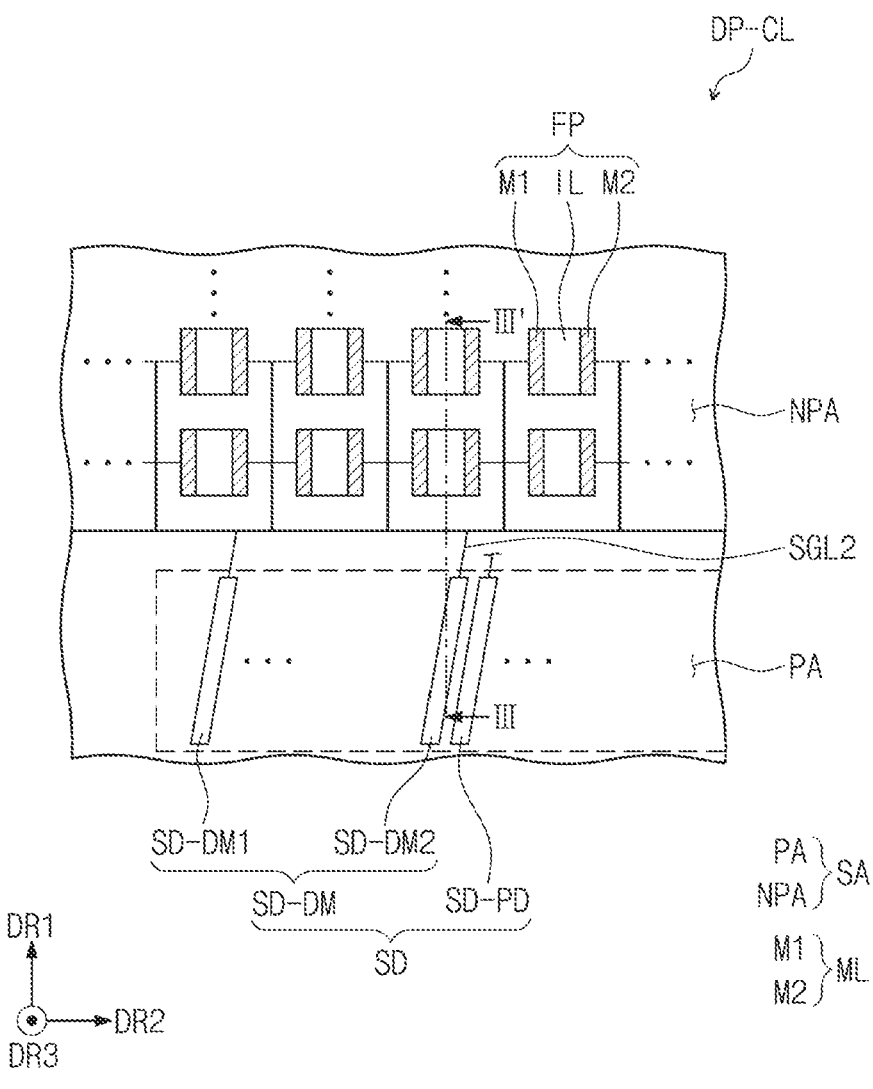
FIG. 7A is a plan view of a partial region of a display panel according to an embodiment of the invention.

FIG. 7A is a plan view illustrating a portion of a stretchable region of a display panel according to an embodiment of the invention.

Referring to FIG. 7A, the circuit element layer DP-CL may include a functional pattern FP, a display pad SD, and a signal line SGL. In an embodiment of the invention, the display panel DP (see FIG. 4) may include the circuit element layer DP-CL, the circuit element layer DP-CL may include a functional layer (not shown), and the functional layer (not shown) may include the functional pattern FP.

The functional pattern FP may include a metal portion ML including a first metal portion M1 and a second metal portion M2 and an insulating portion IL. The insulating portion IL may be disposed between the first metal portion M1 and the second metal portion M2. Accordingly, as the functional pattern FP has a structure in which the insulating portion IL is disposed between the metal portions ML, the functional pattern FP may serve as a capacitor.

The functional pattern FP and the display pad SD may be disposed to overlap the stretchable region SA. The stretchable region SA may include a pad region PA and a non-pad region NPA. For example, the display pads SD may be disposed to overlap the pad region PA and the functional pattern FP may be disposed to overlap the non-pad region NPA. The functional pattern FP and the display pad SD are spaced apart from each other on a plane, but the functional pattern FP may be disposed in a region adjacent to the display pad SD on a plane. Although the drawing exemplarily illustrates that the functional pattern FP is disposed in a region adjacent to the display pad SD in the first direction DR1, the embodiment of the invention is not limited thereto, and the functional pattern FP may be disposed in a region adjacent to the display pad SD in the second direction DR2 in another embodiment and may be freely disposed in a region adjacent to the display pad SD.

The circuit element layer DP-CL may include a plurality of functional patterns FP. That is, in an embodiment of the invention, the functional pattern FP may be provided in plurality. For example, the number of functional patterns FP provided in the display device according to an embodiment of the invention may be about 700,000 or less. The number of functional patterns FP provided in the display device according to an embodiment of the invention may be about 100,000 or more. The plurality of functional patterns FP may be arranged in a matrix form along the first direction DR1 and the second direction DR2 crossing the first direction DR1. The plurality of functional patterns FP may be arranged to completely overlap the stretchable region SA, excluding a region in which the display pad SD is disposed. Accordingly, the plurality of functional patterns FP may have a shape that constitutes one functional layer.

The functional pattern FP may be connected to a panel dummy line SGL2. Each of the first metal portion M1 and the second metal portion M2 of the functional pattern FP may be connected to the panel dummy line SGL2. The panel dummy line SGL2 may be connected to a panel dummy pad SD-DM at the other end thereof so as to transmit an electrical signal to the main circuit board MB (see FIG. 4). Accordingly, the signal of the functional pattern FP may be transmitted to the main circuit board MB (see FIG. 4) through the panel dummy line SGL2. For example, it is possible to measure the capacitance of the functional pattern FP having a structure in which the insulating portion IL is disposed between the metal portions ML.

Referring to FIGS. 4 and 7A together, when the display panel DP and the flexible circuit board FPC are bonded to each other for contact between the display pad SD and the circuit pad LD (see FIG. 6B), at least a portion of the functional pattern FP disposed in a region adjacent to the display pad SD may be stretched. When the display panel DP and the flexible circuit board FPC are bonded to each other, the insulating portion IL of the functional pattern FP may be partially stretched. In an embodiment of the invention, the insulating portion IL of the functional pattern FP may be stretched in the first direction DR1, but may not be stretched in the second direction DR2. When a plurality of functional patterns FP are disposed in the display panel DP, the elongation rates of the plurality of functional patterns FP may be different from each other, respectively. When a plurality of functional patterns FP are disposed, some functional patterns FP may be stretched, but other functional patterns FP may not be stretched. The signals of the plurality of functional patterns FP may be transmitted to any one of the panel dummy pads SD-DM through the panel dummy line SGL2. In an embodiment of the invention, the panel dummy pad SD-DM may include a first panel dummy pad SD-DM1 and a second panel dummy pad SD-DM2, which are spaced apart from each other in a plan view (i.e., on a plane), and the amount of change in the capacitance measured in each of the plurality of functional patterns FP may be transmitted to the first panel dummy pad SD-DM1 or the second panel dummy pad SD-DM2 through the panel dummy line SGL2 connected to each of the plurality of functional patterns FP. The amount of change in the capacitance measured in each of the plurality of functional patterns FP may be transmitted to the flexible circuit board FPC through different panel dummy pads SD-DM1 and SD-DM2, and through this, it is possible to calculate the elongation rate at a position at which each of the plurality of functional patterns FP is disposed in the display panel DP.

In the display device according to an embodiment of the invention, the elongation rate of the display panel may be easily and precisely measured by disposing a specific functional pattern or a functional layer at the lower end of the display panel, to which a flexible circuit board is attached. More specifically, the display device according to an embodiment of the invention includes a display panel having a shape in which electrodes are disposed on opposite sides of an insulator. That is, the display panel includes a specific functional pattern configured to serve as a capacitor. In the display device according to the invention, capacitance may be measured on a circuit board by connecting dummy lines to the functional pattern. Accordingly, the elongation rate of the display panel may be measured based on the dielectric constant of the insulator and the measured capacitance. That is, the elongation rate of the display panel may be measured based on the difference in the capacitance of the functional layer between before and after bonding the display panel and the flexible circuit board to each other. In the display device according to an embodiment of the invention, by disposing a large number of functional patterns on the display panel and connecting the functional patterns in parallel, the capacitance measured on the circuit may have a significant value although the elongation rate of the display panel is so small that it is difficult to measure it. Therefore, it is possible to measure and reflect even a minute elongation that occurs in the display panel. In addition, according to a measurement position, the elongation rate of the display panel may be selectively measured in an arbitrary section within a stretchable region or in the first direction and the second direction. Accordingly, the display device according to the invention makes it possible to easily and precisely calculate the elongation rate of the display panel. Through this, the elongation rate of the display panel may be precisely measured when the display device is manufactured, and therefore, the reliability of the display device manufactured according to an embodiment of the invention may be improved.

Figure 7B:
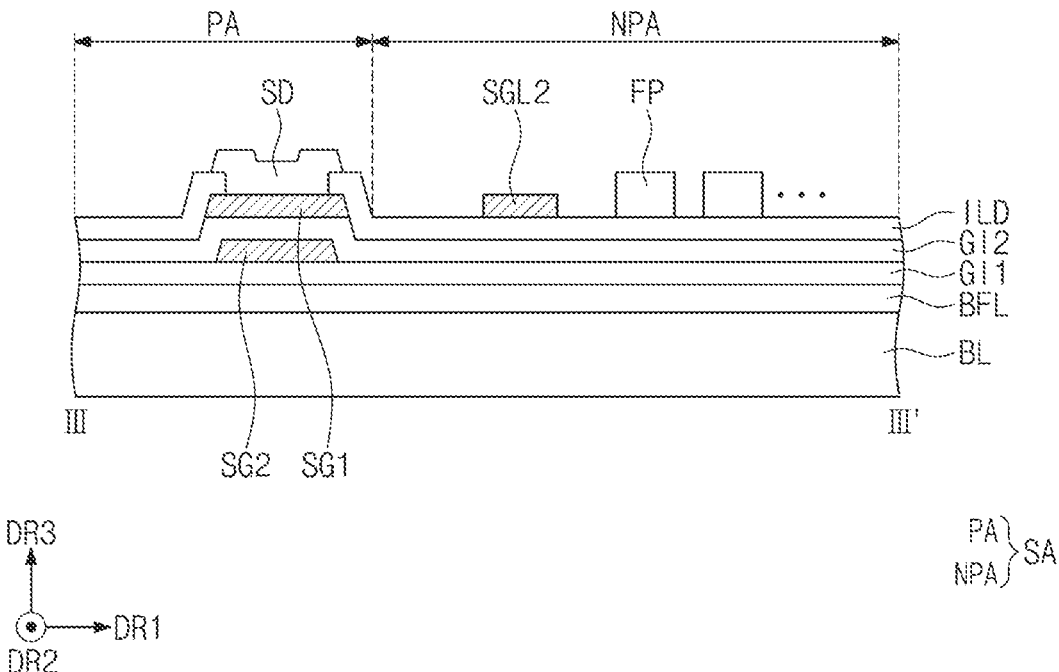
FIG. 7B is a cross-sectional view of a partial region of the display panel according to an embodiment of the invention.

FIG. 7B is a cross-sectional view of a partial region of the display panel according to an embodiment of the invention. FIG. 7B is a cross-sectional view taken along line III-III' illustrated in FIG. 7A.

Referring to FIG. 7B, the display panel DP may include a bottom insulating layer BFL, a first gate insulating layer GI1, a second gate insulating layer GI2, an interlayer-insulating layer ILD, a display pad SD including a plurality of patterns, a first panel gate SG1 including a plurality of patterns, and a second panel gate SG2 including a plurality of patterns. Referring to FIGS. 5 and 7B together, the second panel gate SG2 may be disposed on the first gate insulating layer GI1. The second panel gate SG2 may be disposed on the same layer as the gate G1 of the first transistor T1 and the gate G2 of the second transistor T2. The second gate insulating layer GI2 may be disposed on and cover the second panel gate SG2. The first panel gate SG1 may be disposed on the second gate insulating layer GI2. The first panel gate SG1 may be disposed on the same layer as the upper electrodes UE of the first transistor T1 and the second transistor T2. The interlayer-insulating layer ILD may be disposed on and cover the first panel gate SG1.

Referring to FIG. 7B, each of the functional pattern FP and the display pad SD may be disposed to overlap the stretchable region SA, but they may be spaced apart from each other on a plane (i.e., plan view). For example, the functional pattern FP may be disposed to overlap the non-pad region NPA, and the display pad SD may be disposed to overlap the pad region PA. However, in another embodiment of the invention, opposite the functional pattern FP and the display pad SD may be disposed to overlap the pad region PA and spaced apart from each other on a plane.

Referring to FIG. 7B, the functional pattern FP may be disposed on the base layer BL. In an embodiment of the invention, the functional pattern FP may be disposed on the bottom insulating layer BFL, the first gate insulating layer GI1, the second gate insulating layer GI2, or the interlayer-insulating layer ILD. For example, the functional pattern FP may be disposed directly on the interlayer-insulating layer ILD. Although not illustrated, the upper insulating layer VIA1 (see FIG. 5) may be disposed on the interlayer-insulating layer ILD, and the functional pattern FP may be disposed on the upper insulating layer VIA1 (see FIG. 5). Alternatively, in an embodiment of the invention, the functional pattern FP may be disposed directly on the buffer layer NL (see FIG. 6A), and the buffer layer NL (see FIG. 6A) may be disposed directly on the interlayer-insulating layer ILD.

Figure 8:
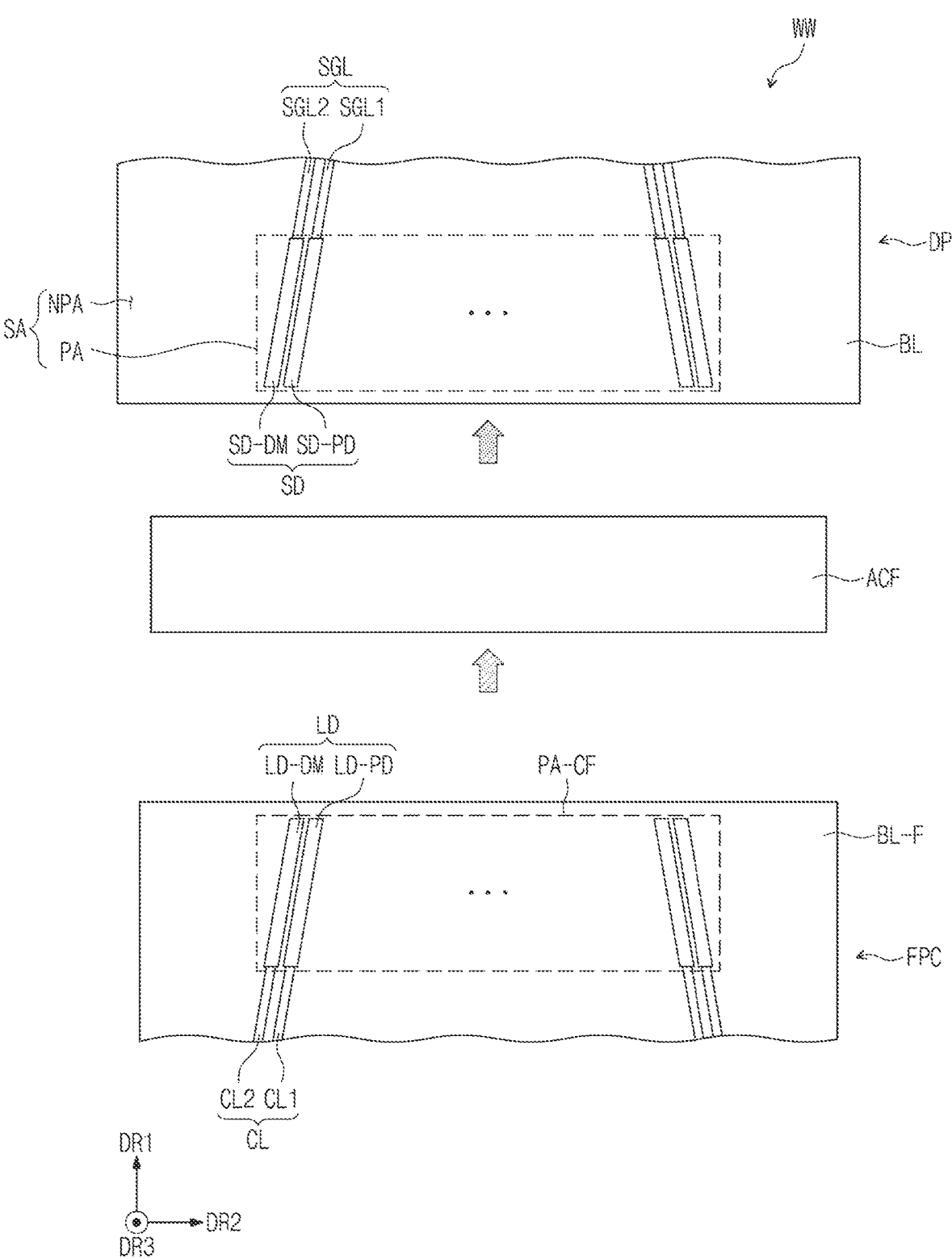
FIG. 8 is a plan view of a partial region of the display module according to an embodiment of the invention.

FIG. 8 is a plan view of a partial region of the display module according to an embodiment of the invention. FIG. 8 is an exploded plan view illustrating an enlarged region WW of FIG. 3.

Referring to FIGS. 3 and 8 together, a pad region PA may be defined in the display panel DP. The pad region PA may be defined in a portion of the stretchable region SA and may be a region in which the display pads SD are disposed.

Referring to FIG. 8, the display panel DP includes a plurality of display pads SD and signal lines SGL connected to the display pads SD. The plurality of display pads SD may be disposed on the base layer BL of the display panel DP.

The plurality of display pads SD may be disposed to overlap the pad region PA of the display panel DP.

The plurality of display pads SD may include an input pad SD-PD and a panel dummy pad SD-DM which are arranged in the second direction DR2. The input pad SD-PD may be electrically connected to a substrate pad LD-PD of the flexible circuit board FPC, and the panel dummy pad SD-DM may be electrically connected to a dummy pad LD-DM of the flexible circuit board FPC.

Signal lines SGL may be connected to the plurality of display pads SD. For example, data lines DL (see FIG. 3) or a control signal line CSL (see FIG. 3) may be connected to the plurality of display pads SD.

The signal lines SGL may include data signal lines SGL1 and panel dummy lines SGL2. One ends of the data signal lines SGL1 may be connected to the input pad SD-PD, and one ends of the panel dummy lines SGL2 may be connected to the panel dummy pad SD-DM. In an embodiment of the invention, the other ends of at least some of the data signal lines SGL1 may be connected to the pixel PX (see FIG. 3). The other ends of at least some of the data signal lines SGL1 may be electrically connected to the light-emitting element ED (see FIG. 5) included in the pixel PX. The other ends of at least some of the panel dummy lines SGL2 may be connected to the metal portions ML, respectively (see FIG. 6A).

Although not illustrated in FIG. 8, the functional pattern FP may be disposed on the stretchable region SA so as to be spaced apart from the display pad SD on a plane as illustrated in FIG. 7A. For example, the functional pattern FP (see FIG. 7A) may be disposed to non-overlap the pad region PA and overlap the non-pad region NPA.

Although not illustrated, the display panel DP may further include a panel alignment mark as an identification mark for identifying the position of the display panel DP or aligning the display panel DP with the flexible printed circuit board CF.

Referring to FIGS. 4 and 8 together, the flexible circuit board FPC included in the flexible printed circuit board CF according to an embodiment of the invention includes a plurality of circuit pads LD and a plurality of circuit lines CL connected to the circuit pads LD. The plurality of circuit pads LD may be disposed on the circuit base layer BL-F of the flexible circuit board FPC. The plurality of circuit pads LD may be disposed to overlap the substrate pad region PA-CF. In FIG. 8, for the convenience of explanation, components such as the plurality of circuit pads LD included in the flexible printed circuit board CF are illustrated by solid lines, but the components included in the flexible printed circuit board CF may be disposed on the rear surface of the circuit base layer BL-F. Although not illustrated, at least some of the plurality of circuit pads LD may be electrically connected to the data driving circuit DC included in the flexible printed circuit board CF through the circuit lines CL.

Referring to FIG. 8, the plurality of circuit pads LD may have a shape corresponding to the display pads SD included in the display panel DP. That is, the extension direction of the plurality of circuit pads LD may be the same as the extension direction of the display pads SD.

The plurality of circuit pads LD may include a substrate pad LD-PD and a dummy pad LD-DM which are arranged along the second direction DR2. The substrate pad LD-PD may be electrically connected to the input pad SD-PD of the display panel DP to provide the display panel DP with an electrical signal for driving the display panel DP. The dummy pad LD-DM may be electrically connected to the panel dummy pad SD-DM of the display panel DP to provide a predetermined signal for driving and testing the display module DM. For example, the dummy pad LD-DM may be electrically connected to the panel dummy pad SD-DM of the display panel DP to provide the main circuit board MB (see FIG. 4) with an electrical signal for measuring the capacitance or elongation of the display panel DP. Accordingly, the invention makes it possible to easily and precisely calculate the elongation rate of the display panel.

Referring to FIG. 8, the circuit lines CL connected to circuit pads LD include output lines CL1 and dummy circuit lines CL2. One ends of the output lines CL1 are connected to the substrate pad LD-PD, and one ends of the dummy circuit lines CL2 are connected to the dummy pad LD-DM. Although not illustrated, the other ends of the output lines CL1 and the dummy circuit lines CL2 may come in contact with pads electrically connected to the main circuit board MB.

Although not illustrated, the flexible circuit board FPC may further include a circuit alignment mark as an identification mark for aligning the flexible printed circuit board CF with the display panel DP.

Referring to FIGS. 4 and 8 together, the substrate pad region PA-CF of the flexible circuit board FPC of the flexible printed circuit board CF and the pad region PA of the display panel DP may be electrically connected to each other by a conductive adhesive film ACF. The pad portion (not illustrated) of the flexible circuit board FPC and the pad portion (not illustrated) of the main circuit board MB may also be electrically connected to each other by the conductive adhesive film ACF. The conductive adhesive film ACF may be an anisotropic conductive film ("ACF").

Hereinafter, a method of manufacturing a display panel according to an embodiment of the invention will be described with reference to the drawings.

Figure 9:
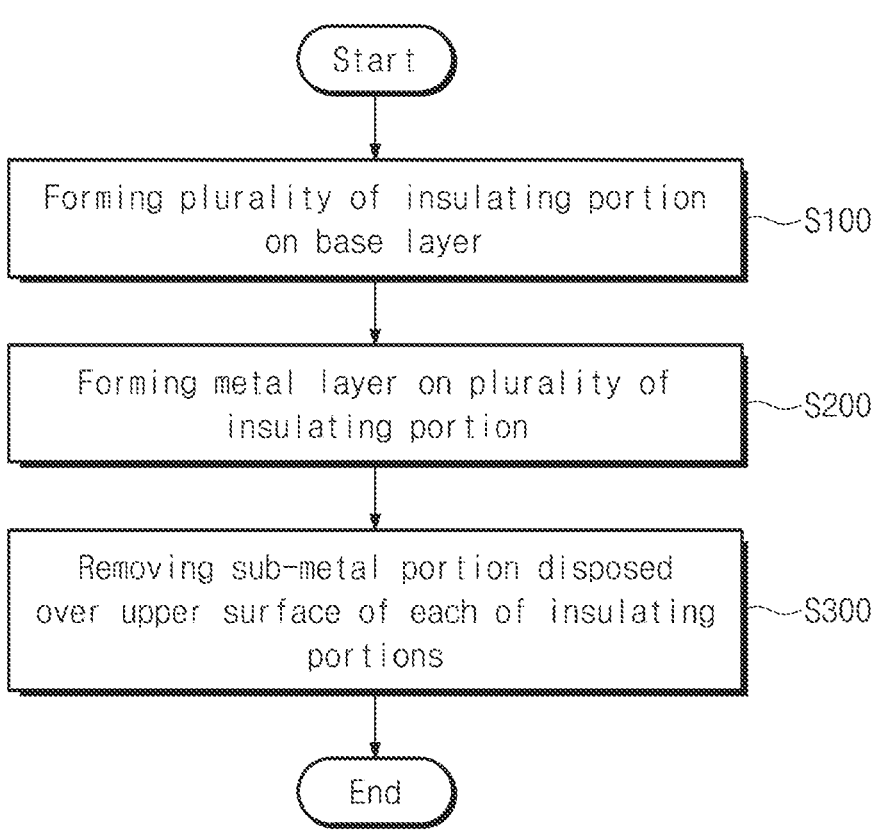
FIG. 9 is a flowchart showing a method of manufacturing the display panel according to an embodiment of the invention.

FIG. 9 is a flowchart showing a method of manufacturing the display panel according to an embodiment of the invention.

Figure 10A:
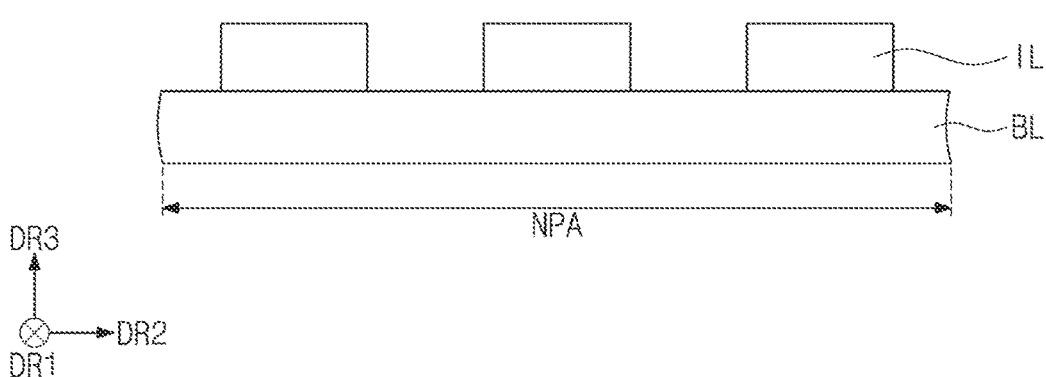
FIGS. 10A to 10C are cross-sectional views illustrating some steps of the method of manufacturing the display panel according to an embodiment of the invention.
Figure 10B:
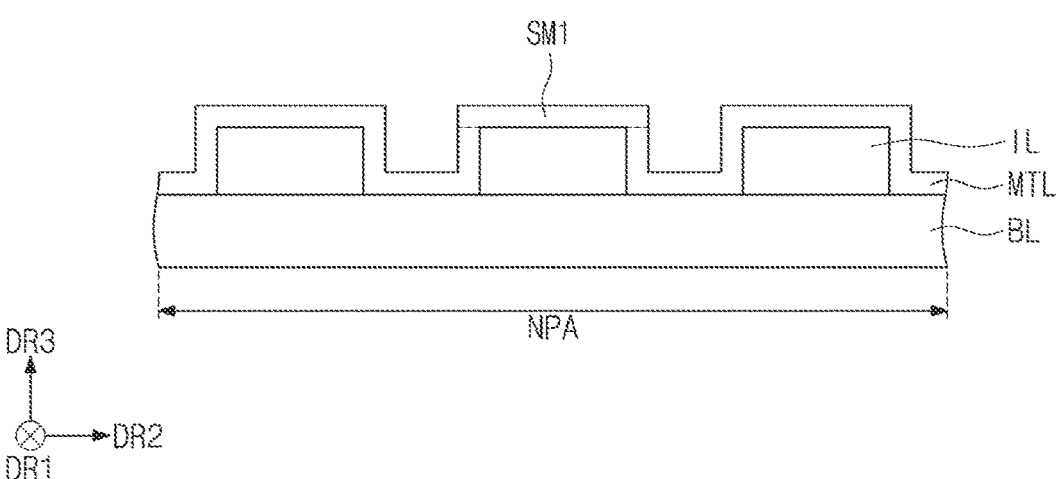
Figure 10C:
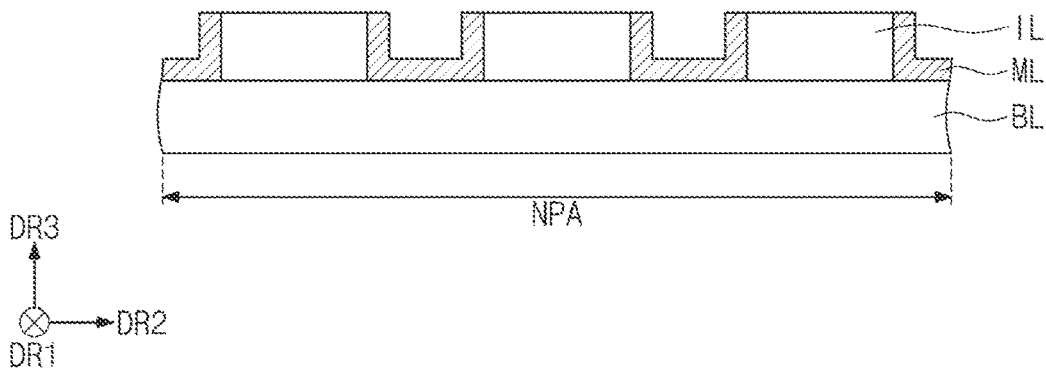

FIGS. 10A to 10C are cross-sectional views illustrating some steps of the method of manufacturing the display panel according to an embodiment of the invention. In describing the method of manufacturing the display panel according to an embodiment of the invention, the same reference numerals are given to the same components as those described above, and the detailed descriptions thereof will be omitted.

Referring to FIGS. 9 and 10A to 10C, the method of manufacturing the display panel according to an embodiment of the invention includes forming a plurality of insulating portions IL in a matrix form on a base layer BL (S100), forming a metal layer MTL on the plurality of insulating portions IL (S200), and removing a first sub-metal portion SM1 of the metal layer MTL, which is disposed above the upper surface of the insulating portion (S300).

Referring to FIG. 10A, the method of manufacturing the display panel according to an embodiment of the invention includes forming a plurality of insulating portions IL in a matrix form on a base layer BL. The plurality of insulating portions IL may be formed to be arranged in a matrix form along a first direction DR1 and a second direction DR2 crossing the first direction DR1. The base layer BL may include a display region DA and a non-display region NDA, and the plurality of insulating portions IL may be formed to overlap the non-display region NDA. The plurality of insulating portions IL may overlap the non-display region NDA, but may be formed to be spaced apart from the display pad SD in a plan view (see FIG. 6B). The method of manufacturing the display panel according to an embodiment of the invention may further include comprising forming a buffer layer on the display panel DP so that the buffer layer overlaps the non-display region NDA prior to the forming of the plurality of insulating portions IL.

Referring to FIG. 10B, the method of manufacturing the display panel according to an embodiment of the invention includes forming a metal layer MTL on a plurality of insulating portions IL. When the plurality of insulating portions IL are formed in a single row in the first direction DR1, one metal layer MTL may be formed. When the plurality of insulating portions IL are formed in a plurality of rows in the first direction DR1, a plurality of metal layers MTL spaced apart from each other in the first direction DR1 may be formed.

Referring to FIGS. 10B and 10C, the method of manufacturing the display panel according to an embodiment of the invention includes removing the first sub-metal portion SM1 of the metal layer MTL, which is disposed above the upper surface of the insulating portion. The metal layer MTL may include the first sub-metal portion SM1 over the upper surface of the insulating portion. The first sub-metal portion SM1 of the metal layer MTL may be removed through laser irradiation. As the first sub-metal portion SM1 is removed from the upper surface of the insulating portion IL, at least a portion of the upper surface of the insulating portion IL may be exposed. In an embodiment of the invention, as the first sub-metal portion SM1 is removed, the entire upper surface of the insulating portion IL may be exposed. Accordingly, the metal portion ML according to an embodiment of the invention may be manufactured in such a way that two metal portions are spaced apart from each other in the second direction DR2 with the insulating portion IL interposed therebetween. When the method of manufacturing the display panel according to the embodiment of the invention is used, the elongation rate of the manufactured display panel may be precisely measured. Therefore, it is possible to provide the display panel and the display device having improved reliability.

According to an embodiment of the invention, it is possible to precisely measure the extent to which a flexible display panel is stretched in a process of bonding a flexible printed circuit board and a display panel to each other. Therefore, it is also possible to design the display panel in consideration of the elongation rate of the display panel during the manufacturing process of the display device, and through this, the reliability of the manufactured display device may be effectively improved.

Although the above has been described with reference to preferred embodiments of the invention, those skilled in the art or those of ordinary skill in the art will understand that various modifications and changes can be made to the invention within the scope that does not depart from the spirit and technical field of the invention described in the claims to be described later. Accordingly, the technical scope of the invention should not be limited to the content described in the detailed description of the specification, but should be determined by the claims described hereinafter.

What is claimed is:

1. A display device comprising:
a display panel divided into a non-display region comprising a stretchable region and a display region adjacent to the non-display region; and
a flexible printed circuit board disposed to overlap the stretchable region and comprising circuit pads,
wherein the display panel comprises:

display pads disposed to overlap the stretchable region and electrically connected to the circuit pads at least partially; and
a functional pattern disposed to overlap the stretchable region and spaced apart from the display pads in a plan view,
wherein the functional pattern comprises:
an insulating portion;
a first metal portion disposed on a first side surface of the insulating portion; and
a second metal portion disposed on a second side surface of the insulating portion, which is opposite to the first side surface.

2. The display device of claim 1, wherein:
the stretchable region comprises a pad region and a non-pad region adjacent to the pad region;
the display pad is disposed to overlap the pad region; and
the functional pattern is disposed to overlap the non-pad region.

3. The display device of claim 1, wherein the functional pattern is provided in plurality,
wherein the plurality of functional patterns are arranged in a matrix form along a first direction and a second direction crossing the first direction,
wherein the first metal portion and the second metal portion are arranged in the first direction.

4. The display device of claim 1, wherein the display panel further comprises a buffer layer disposed below the functional pattern.

5. The display device of claim 1, wherein:
the display panel further comprises signal lines connected to the display pads; and
the first metal portion and the second metal portion are connected to at least some of the signal lines, respectively.

6. The display device of claim 1, wherein:
the display panel further comprises:
a base layer disposed below the display pads,
a conductive layer disposed on the base layer,
an insulating layer having at least a portion disposed on the conductive layer, and
a light-emitting element disposed on the insulating layer and overlapping the display region; and
wherein the functional pattern is disposed on the insulating layer.

7. The display device of claim 6, wherein:
the insulating layer comprises a first insulating layer, a second insulating layer disposed on the first insulating layer, and a third insulating layer disposed on the second insulating layer; and
the functional pattern is disposed on the third insulating layer.

8. The display device of claim 6, wherein the display pads comprise an input pad and a panel dummy pad,
wherein at least a portion of the input pad is connected to the light-emitting element.

9. The display device of claim 8, wherein the display panel further comprises signal lines connected to the display pads,
wherein the signal lines comprise panel dummy lines connected to the panel dummy pad.

10. The display device of claim 9, wherein the first metal portion and the second metal portion are connected to at least some of the panel dummy lines, respectively.

11. The display device of claim 1, further comprising a conductive adhesive film disposed between the display panel and the flexible printed circuit board, wherein the conductive adhesive film electrically connects the display pads and the circuit pads to each other.

12. The display device of claim 1, wherein the display panel further comprises a base layer disposed below the display pad, wherein the base layer comprises a flexible material.

13. The display device of claim 1, wherein the flexible printed circuit board comprises a circuit base layer on which the circuit pads are disposed, wherein the circuit base layer comprises a flexible material.

14. The display device of claim 1, wherein the insulating portion comprises polypropylene or polyester.

15. The display device of claim 1, wherein the first metal portion and the second metal portion comprise at least any one of aluminum (Al), titanium (Ti), copper (Cu), or gold (Au).

16. A display panel comprising:

a base layer divided into a display region and a non-display region;

a circuit element layer disposed on the base layer and comprising a display pad and a functional layer, which overlap the non-display region and are spaced apart from each other in a plan view; and a display element layer comprising a light-emitting element overlapping the display region and disposed on the circuit element layer, wherein the functional layer comprises a plurality of functional patterns arranged in a matrix form along a first direction and a second direction crossing the first direction, wherein each of the plurality of functional patterns comprises:

an insulating portion;

a first metal portion disposed on a first side surface of the insulating portion; and a second metal portion disposed on a second side surface of the insulating portion opposite to the first side surface.

17. A method for manufacturing a display device, the method comprising:

forming a plurality of insulating portions in a matrix form along a first direction and a second direction crossing the first direction on a base layer, wherein the base layer is divided into a non-display region in which a display pad is disposed and a display region adjacent to the non-display region;

forming a metal layer on the plurality of insulating portions; and removing sub-metal portion of the metal layer disposed over an upper surface of each of the plurality of insulating portions such that at least a portion of the upper surface of each of the plurality of insulating portions is exposed, wherein, in the forming of the plurality of insulating portions, the plurality of insulating portions is formed so as to overlap the non-display region and be spaced apart from the display pad in a plan view.

18. The method of claim 17, wherein:

the non-display region comprises a pad region and a non-pad region;

the display pad is disposed in the pad region; and the plurality of insulating portions is formed in the non-pad region.

19. The method of claim 17, further comprising forming a buffer layer on the base layer so as to overlap the non-display region prior to the forming of the plurality of insulating portions.

20. The method of claim 17, wherein the removing of the sub-metal portion is performed by removing the sub-metal portion through laser irradiation.

* * * * *